United States Patent
Hsieh et al.

(10) Patent No.: US 9,191,012 B2
(45) Date of Patent: Nov. 17, 2015

(54) TEMPERATURE COMPENSATED MEMS OSCILLATOR

(71) Applicant: HARMONY ELECTRONICS CORP., Kaohsiung (TW)

(72) Inventors: Shui-Yuan Hsieh, Kaohsiung (TW); Hsin-Hung Li, Taichung (TW)

(73) Assignee: HARMONY ELECTRONICS CORP., Kaohsiung (TW)

( * ) Notice: Subject to any disclaimer, the term of this patent is extended or adjusted under 35 U.S.C. 154(b) by 13 days.

(21) Appl. No.: 14/207,671

(22) Filed: Mar. 13, 2014

(65) Prior Publication Data

US 2015/0214956 A1 Jul. 30, 2015

(30) Foreign Application Priority Data

Jan. 24, 2014 (TW) .............................. 103102726 A

(51) Int. Cl.
*H03L 1/02* (2006.01)
*H03B 5/30* (2006.01)
*B81B 7/00* (2006.01)

(52) U.S. Cl.
CPC ................ *H03L 1/022* (2013.01); *B81B 7/008* (2013.01); *H03B 5/30* (2013.01)

(58) Field of Classification Search
CPC ....................................................... H03L 1/022

USPC ................................ 331/66, 69, 70, 176, 154
See application file for complete search history.

(56) References Cited

U.S. PATENT DOCUMENTS

| | | | |
|---|---|---|---|
| 7,211,926 B2 * | 5/2007 | Quevy et a | 310/315 |
| 7,221,241 B2 | 5/2007 | Lutz et al. | |
| 7,268,646 B2 | 9/2007 | Lutz et al. | |
| 8,390,387 B2 * | 3/2013 | Lander | 331/154 |
| 8,466,754 B1 * | 6/2013 | Olen et al. | 331/116 M |
| 2012/0305542 A1 | 12/2012 | Donnay et al. | |

* cited by examiner

*Primary Examiner* — Joseph Chang
(74) *Attorney, Agent, or Firm* — CKC & Partners Co., Ltd.

(57) ABSTRACT

A temperature compensated Micro Electro Mechanical (MEMS) oscillator is provided. The oscillator includes a MEMS resonator group, a heating device, a connection body, and a controller. The MEMS resonator group includes a first MEMS resonator and a second MEMS resonator. The first MEMS resonator is configured to output a main oscillation frequency. The second MEMS resonator is configured to output an auxiliary oscillation frequency according to a temperature of the second MEMS resonator. The heating device is configured to increase a temperature of the MEMS resonator group. The connection body is connected between the MEMS resonator group and the heating device to transmit heat from the heating device to the MEMS resonator group, and configured to electrically isolate the MEMS resonator group from the heating device. The controller is configured to control the heating device according to a difference between the main oscillation frequency and the auxiliary oscillation frequency.

10 Claims, 5 Drawing Sheets

TEMPERATURE COMPENSATED MEMS OSCILLATOR

RELATED APPLICATIONS

This application claims priority to Taiwan Application Serial Number 103102726, filed on Jan. 24, 2014, which is herein incorporated by reference.

BACKGROUND

1. Field of Invention

The present disclosure relates to a temperature compensated oscillator. More particularly, the present disclosure relates to a micro electro mechanical systems (MEMS) temperature compensated oscillator.

2. Description of Related Art

An oscillator is an electronic device used to generate a periodic signal (such as a square wave or a sine wave). Currently, a common electric device, such as a signal generator, a frequency synthesizer, or a phase lock loop, uses an oscillator to provide periodic signals required for operation.

A quartz oscillator is one of the most popular oscillators presently. Since the quartz oscillator has advantages of simple structure and low cost, the quartz oscillator is popularly used in various electronic products. However, due to the limitation of mechanical cutting operations and polishing operations used to process quartz crystals, it is not easy to fabricate a quartz element having a small size and a high frequency. Therefore, a trend of using a micro electro mechanical systems (MEMS) oscillator to replace the quartz oscillator is gradually developed.

For fabricating the MEMS oscillator, a semiconductor technology is first used to fabricate a resonator structure, and then by using a System in Package (SiP) technology is used to integrate a controller and the resonator structure in a single chip package. Since the MEMS resonator is formed from silicon the processes for fabricating the MEMS oscillator are compatible with semiconductor processes. Also, the MEMS oscillator has various oscillation modes, and thus a high frequency element with a small size can be fabricated thereby. However, since being affected by a Temperature Coefficient of Young's Modulus (TCE), a Coefficient of Thermal Expansion (CTE), etc. of the MEMS resonator, the frequency of the MEMS resonator is drifted with temperature changes. Therefore, a temperature compensation design is needed to increase the stability of the frequency of the MEMS resonator

SUMMARY

An aspect of the present disclosure is to provide a temperature compensated oscillator. The temperature compensated oscillator uses a MEMS resonator to sense an environment temperature, thereby controlling a work state of a heating device to maintain temperature of MEMS resonators of the temperature compensated oscillator at a predetermined temperature.

According to an embodiment of the present disclosure, the temperature compensated oscillator includes a MEMS resonator group, a heating device, a connection body, and a controller. The MEMS resonator group includes a first MEMS resonator and a second MEMS resonator. The first MEMS resonator is configured to output a main oscillation frequency. The second MEMS resonator is configured to output an auxiliary oscillation frequency. The heating device is configured to increase temperature of the MEMS resonator group. The connection body is connected between the MEMS resonator group and the heating device to transmit heat from the heating device to the MEMS resonator group, and configured to electrically isolate the MEMS resonator group from the heating device. The controller is configured to control the heating device according to a difference between the main oscillation frequency and the auxiliary oscillation frequency.

It can be known from the above descriptions that the temperature compensated oscillator of the present disclosure includes two resonators, in which the first MEMS resonator is used to output the main oscillation frequency desired by a user, and the second MEMS resonator is used to sense the change of temperature and to output the auxiliary oscillation frequency accordingly. By receiving the difference between the main oscillation frequency and the auxiliary oscillation frequency, the controller can drive and maintain the heater according to the temperature change of the resonators for enabling the first MEMS resonator to work at the predetermined temperature. However, when the controller applies control voltages on the heating device, the resonators maybe affected by the control voltages, and thus the connection body is used to electrically isolate the resonators from the heating device.

BRIEF DESCRIPTION OF THE DRAWINGS

These and other features, aspects, advantages and embodiments of the present disclosure will become better understood with regard to the following accompanying drawings where.

DETAILED DESCRIPTION

Figure 1:
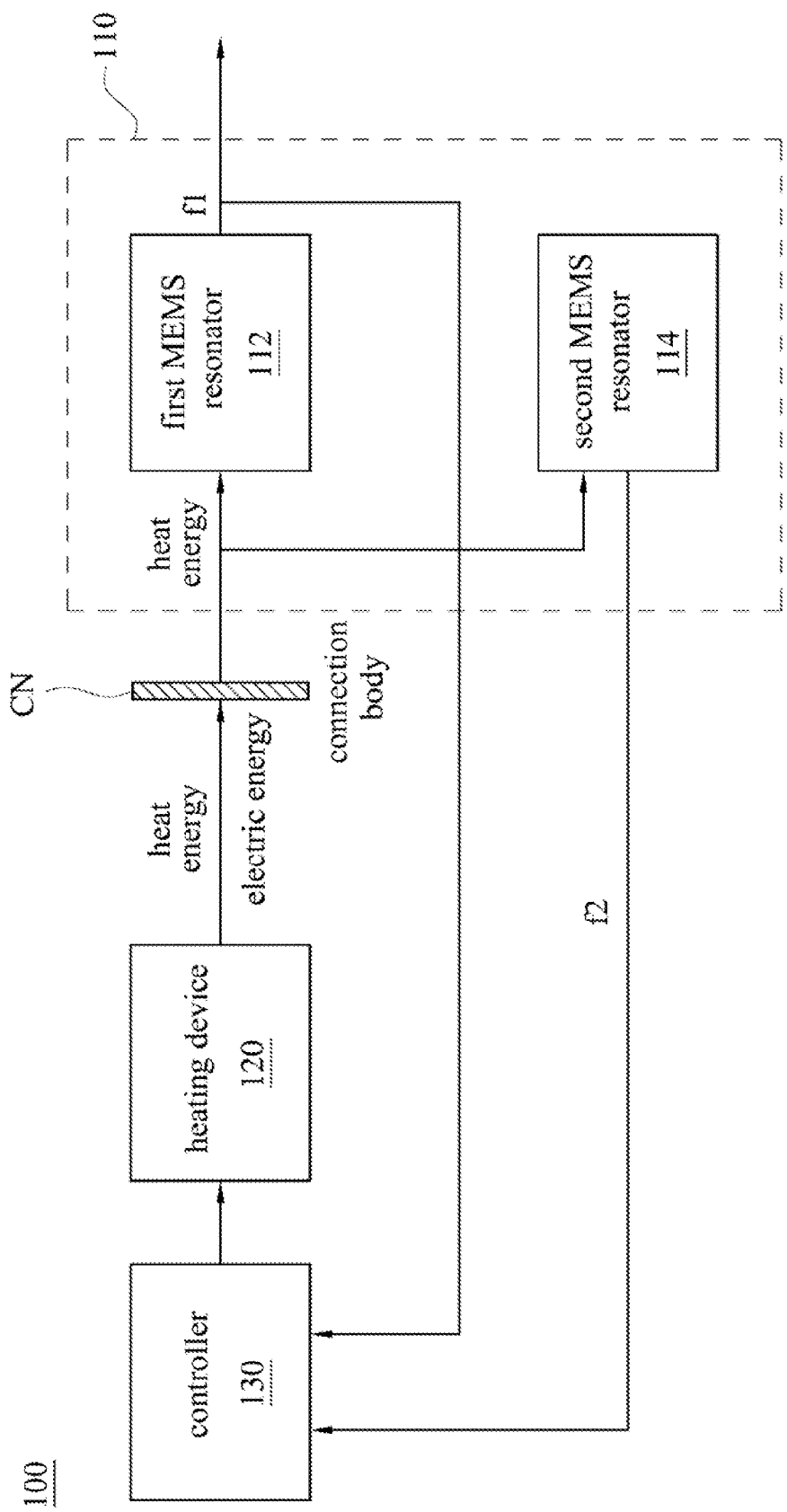
FIG. 1 shows a functional block diagram of a temperature compensated oscillator according to embodiments of the present invention.

Referring to FIG. 1, FIG. 1 shows a functional block diagram of a temperature compensated oscillator 100 according to embodiments of the present invention. The temperature compensated oscillator 100 includes a MEMS resonator group 110, a heating device 120, a controller 130, and connection bodies CN. In the embodiments of the present invention, the heating device 120 is configured to increase temperature of the MEMS resonator group 110, and the controller 130 is configured to control a work state of the heating device 120 according to a difference of the frequencies output by the MEMS resonator group 110. The connection bodies CN are disposed between the heating device 120 and the MEMS resonator group 110 to transmit heat energy generated by the heating device 120 to the MEMS resonator group 110, and to electrically isolate the MEMS resonator group 110 from the heating device 120.

The MEMS resonator group 110 includes a first MEMS resonator 112 and a second MEMS resonator 114. The first MEMS resonator 112 is configured to output a first periodic signal having a main oscillation frequency f1. The second MEMS resonator 114 is configured to output a second periodic signal according to temperature of the second MEMS resonator 114, in which the second periodic signal has an auxiliary oscillation frequency f2. In the present embodiment, the oscillator 100 is a temperature compensated MEMS oscillator, and thus the first MEMS resonator 112 and the second MEMS resonator 114 maintain stability of the main oscillation frequency f1 and the auxiliary oscillation frequency f2 according to voltage signals provided by internal driving circuits. However, the embodiments of the present invention are not limited thereto.

In general, main material of MEMS resonators is silicon, and a temperature coefficient of frequency (TCF) of silicon is negative. In order to decrease temperature sensitivity of the main oscillation frequency f1, the first MEMS resonator 112 is formed from composite material in which material having a positive TCF, such as $SiO_2$, is embedded. However, the embodiments of the present invention are not limited thereto.

Although the first MEMS resonator 112 is formed from materials including the positive TCF material, a change of temperature of the first MEMS resonator 112 may slightly affect the main oscillation frequency f1. Therefore, the heating device 120 is used to maintain the temperature of the first MEMS resonator 112 at a predetermined working temperature (for example, 85° C.), and the second MEMS resonator 114 is used to sense temperature, thereby controlling the heating device 120 to adjust temperature of the MEMS resonator group 110 according to the sensing result.

Figure 2:
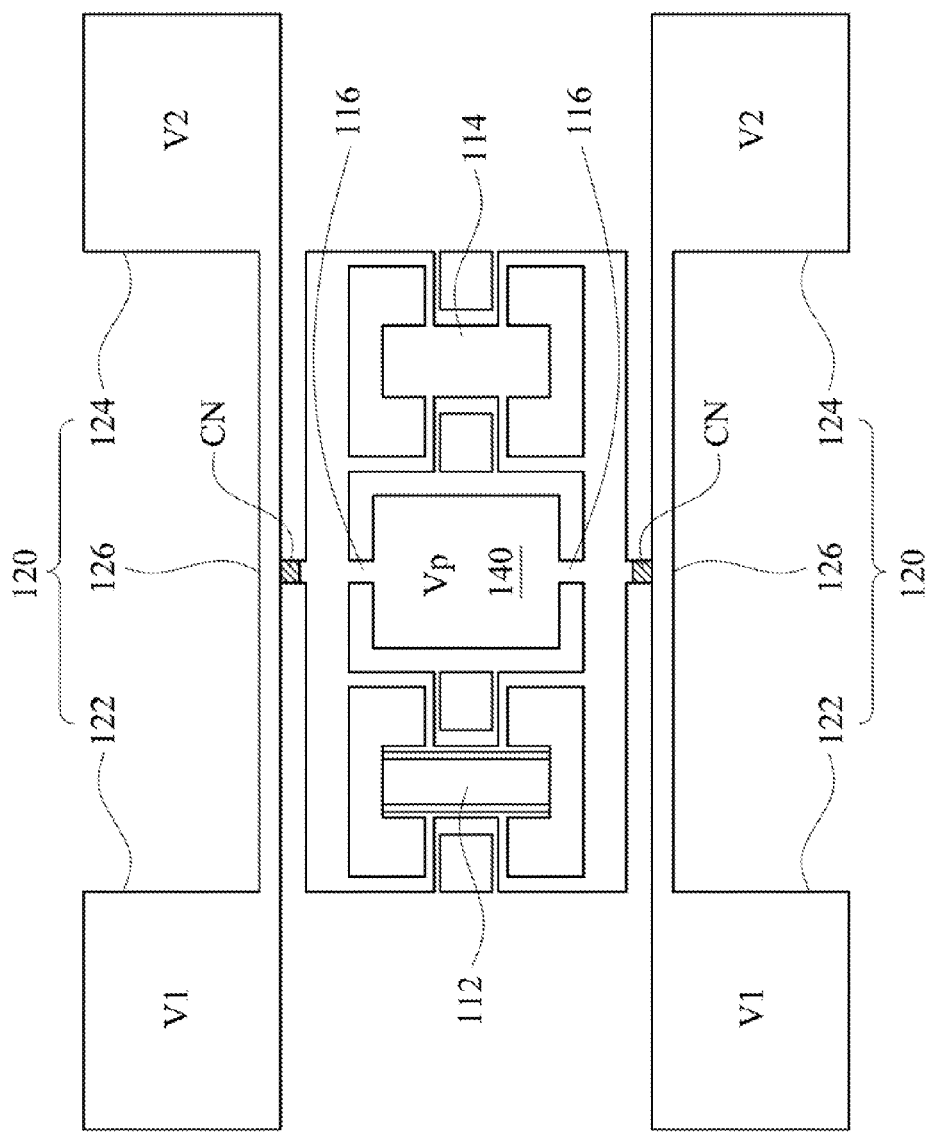
FIG. 2 shows a top view of the temperature compensated oscillator according to embodiments of the present invention.

Referring to FIG. 2, FIG. 2 shows a top view of the temperature compensated oscillator 100 according to embodiments of the present invention. The heater 120 includes first contact pads 122, second contact pads 124, and resistors 126. The first contact pads are used to provide a first temperature control voltage V1. The second contact pads 124 are used to provide a second temperature control voltage V2. The resistors 126 are electrically connected between the first contact pads 122 and the second contact pads 124 to use a voltage difference between the first temperature control voltage V1 and the second temperature control voltage V2 to provide heat energy to the MEMS resonator group 110.

In this embodiment, the heat energy generated by the resistors 126 may be transmitted to a frame 116 of the MEMS resonator group 110 through connection bodies CN, and then the frame 116 transmits the heat energy to the resonator group 110. The connection bodies CN are connected between the resistors 126 and the resonator group 110 and formed from electric insulation materials. In this embodiment, the connection bodies CN are formed from $SiO_2$, but embodiments of the present invention are not limited thereto. The resistors 126, the connection bodies CN, the first MEMS resonator 112, and the second MEMS resonator 114 are suspend above a semiconductor substrate (not illustrated), so that a good heat isolation environment is provided for conveniently controlling the temperature of the first MEMS resonator 112, the package of the temperature compensated oscillator 100, air can be drew out to form an vacuum environment in the package for obtaining a better heat isolation effect.

In addition, the temperature compensated oscillator 100 further includes a proof mass voltage supply circuit 140 to provide a proof mass voltage $V_p$ to the first MEMS resonator 112 and the second MEMS resonator 114 for helping the first MEMS resonator 112 and the second MEMS resonator 114 start oscillating.

Figure 3:
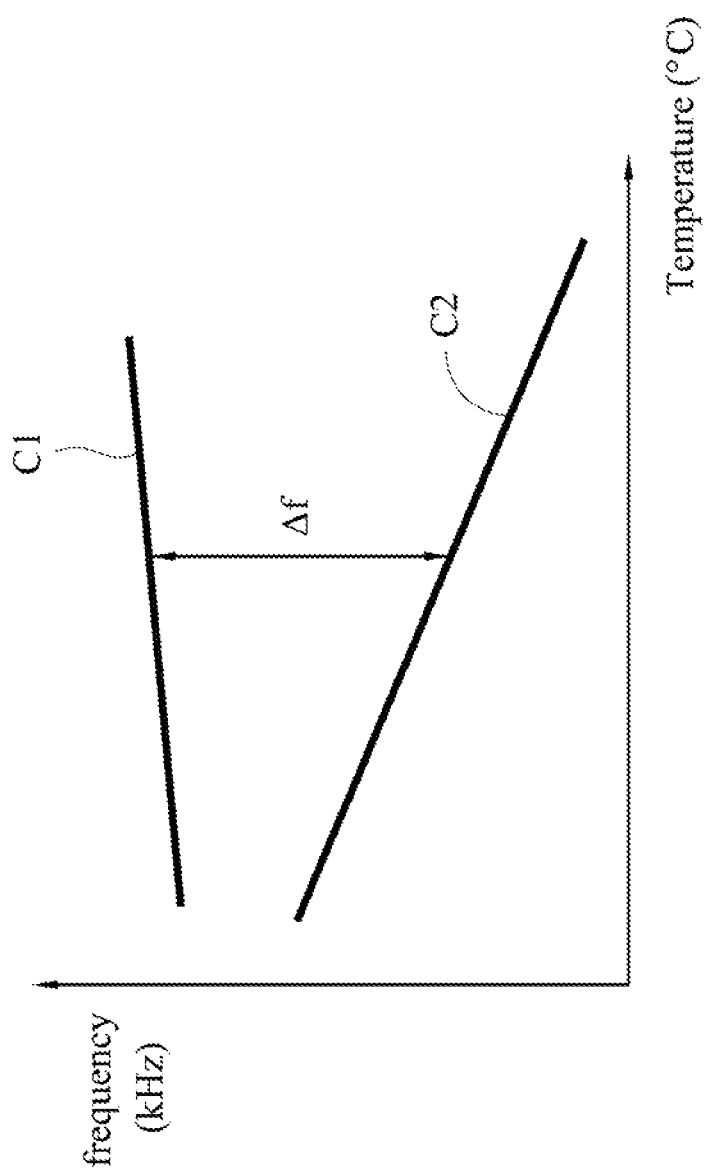
FIG. 3 shows relationships between temperature and output frequencies of the MEMS resonator group according to the embodiments of the present invention.

Referring to FIG. 3, FIG. 3 shows relationships between temperature and output frequencies of the MEMS resonator group 110 according to the embodiments of the present invention, in which a curve C1 represents a relationship between temperature and an output frequency of the first MEMS resonator 112 and a curve C2 represents a relationship between temperature and an output frequency of the second MEMS resonator 114. As mentioned above, the first. MEMS resonator 112 includes positive TCF material to decrease the temperature sensitivity of the main oscillation frequency f1. Therefore, compared with the curve C1 of the first MEMS resonator 112, the curve C2 of the second MEMS resonator 114 has a slope having a greater value, so as to make the temperature sensing more convenient.

In this embodiment, the controller 130 receives the main oscillation frequency f1 output by the first MEMS resonator 112 and the auxiliary oscillation frequency f2 output by the second MEMS resonator 114, and performs a temperature control operation according to a frequency difference Δf between the main oscillation frequency f1 and the auxiliary oscillation frequency f2. As shown in FIG. 3, it is represented that the temperature of the MEMS resonator group 110 is increased when the frequency difference Δf is increased. contrast, it is represented that the temperature of the MEMS resonator group 110 is decreased when the frequency difference Δf is decreased. Therefore, in this embodiment, a frequency difference corresponding to the predetermined working temperature can be measured as a standard value of the frequency difference Δf in advance, and then the controller 130 can control the heating device 130 according to the standard value of the frequency difference Δf. For example, it is represented that the temperature of the MEMS resonator group 110 is too high, when the difference between the main oscillation frequency f1 and the auxiliary oscillation frequency f2 is greater than the standard value of frequency difference, and thus the controller 130 decreases the voltage difference to decrease the heat energy provided by the heating device 120. For another example, it is represented that the temperature of the MEMS resonator group 110 is too low, when the difference between the main oscillation frequency f1 and the auxiliary oscillation frequency f3 is smaller than the standard value of frequency difference, and thus the controller 130 increases the voltage difference to increase the heat energy provided by the heating device 120. In addition, in other embodiments of the present invention, a relationship curve presenting a relationship between the frequency difference Δf and the temperature of the MEMS resonator group 110 can be established, and thus the frequency difference Δf can be used to dynamically control the temperature of the MEMS resonator group 110.

It can be known from the above description that the temperature compensated oscillator 100 uses the frequency difference between the frequencies of the first MEMS resonator 112 and the second MEMS resonator 114 to determine if the temperature of the MEMS resonator group 110 is increased or decreased, and maintain the temperature of the MEMS resonator group 110 at the predetermined working temperature according to the frequency difference. Since the second MEMS resonator 114 and the first MEMS resonator 112 can be fabricated in the same process, the temperature compensated oscillator 100 of the embodiments of the present invention has advantages of simple fabrication process and low cost.

Figure 4A:
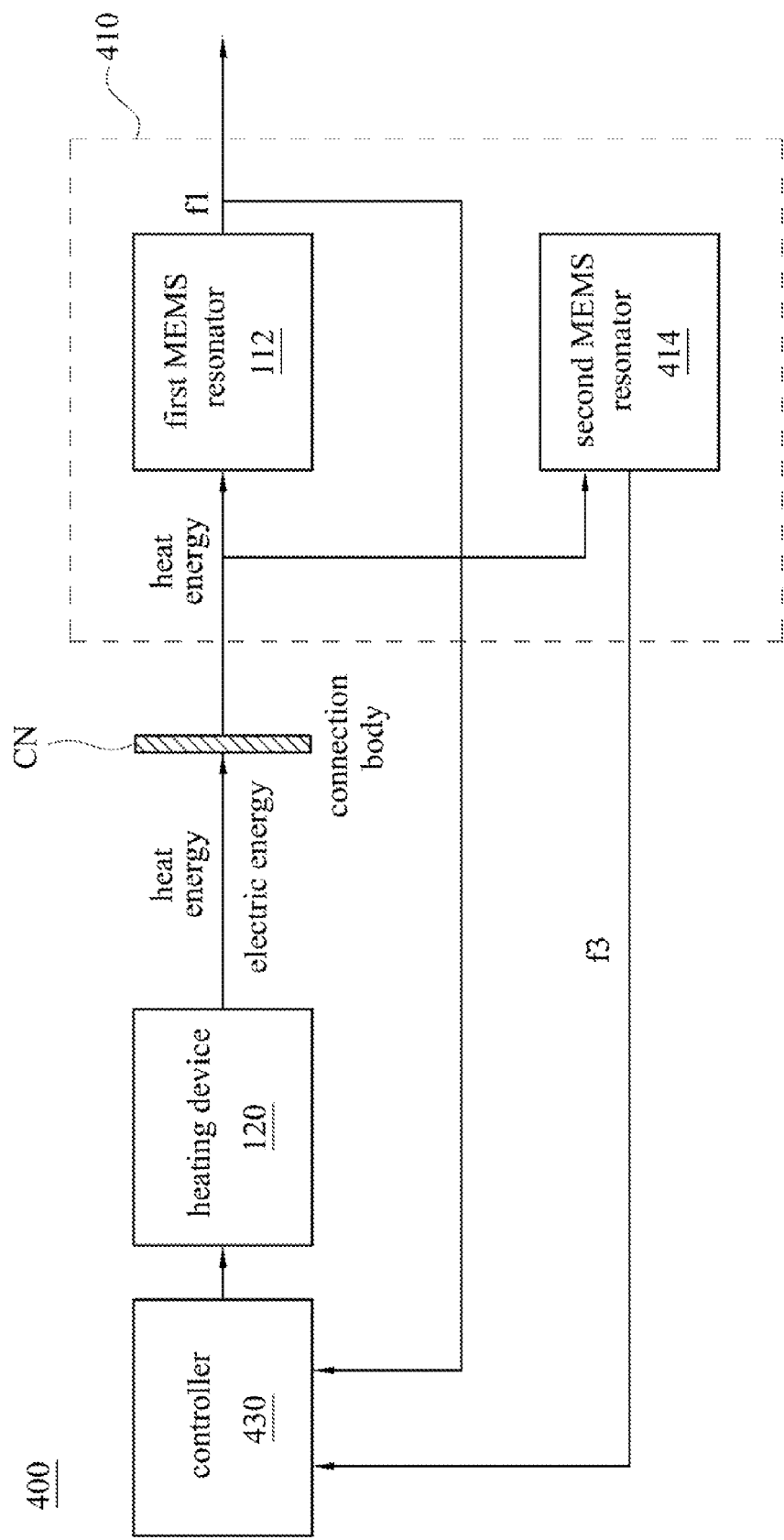
FIG. 4A shows a functional block diagram of a temperature compensated oscillator according to embodiments of the present invention.
Figure 4B:
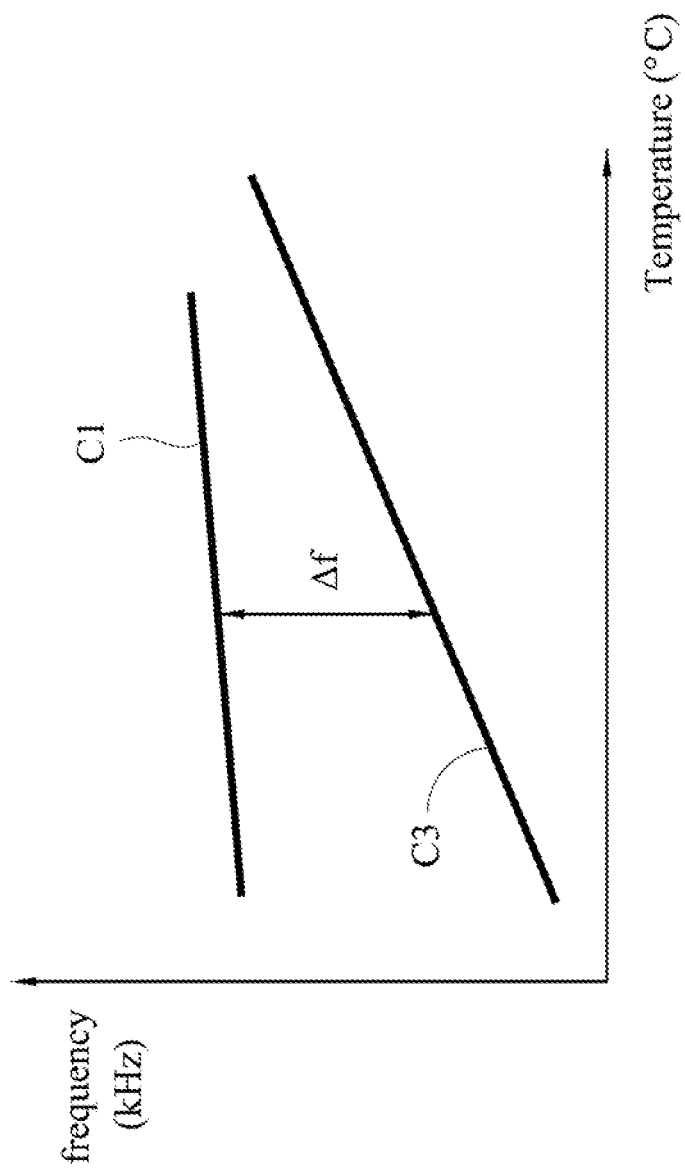
FIG. 4B shows relationships between temperature and output frequencies of a MEMS resonator group according to the embodiments of the present invention.

Referring to FIG. 4A and FIG. 4B simultaneously, FIG. 4A shows a functional block diagram of a temperature compensated oscillator 400 according to embodiments of the present invention, and FIG. 4B shows relationships between temperature and output frequencies of a MEMS resonator group 410 according to the embodiments of the present invention, in which a curve C3 represents a relationship between temperature and output frequency of a second MEMS resonator 414. The temperature compensated oscillator 400 is similar to the oscillator 100, but the difference is in that the oscillator 400 includes the MEMS resonator group 410 and a controller 430.

The MEMS resonator group 410 is similar to the MEMS resonator group 110. The MEMS resonator group 410 includes the first MEMS resonator 112 and the second MEMS resonator 414. The second MEMS resonator 414 is configured to output an auxiliary oscillation frequency f3 and includes material having a positive TCF. As shown in FIG. 4B, in this embodiment, the positive TCF material enables a slope of the curve C3 to be greater than that of the curve C1 of the first MEMS resonator 112. Therefore, it is represented that the temperature of the MEMS resonator group 410 is decreased when the frequency difference Δf is increased. In contrast, it is represented that the temperature of the MEMS resonator group 410 is increased when the frequency difference Δf is decreased.

The controller 430 is similar to the controller 130, but the difference is in that the controller 430 controls the heating device 120 in different ways. For example, it is represented that the temperature of the MEMS resonator group 410 is too low, when the difference between the main oscillation frequency f1 and the auxiliary oscillation frequency f3 is greater than the standard value of frequency difference, and thus the controller 430 turn on the heating device 120 for increasing the temperature of the MEMS resonator group 410. For another example, it is represented that the temperature of the MEMS resonator group 410 is too high, when the difference between the main oscillation frequency f1 and the auxiliary oscillation frequency f3 is smaller than the standard value of frequency difference, and thus the controller 430 turn off the heating device 120 for decreasing the temperature of the MEMS resonator group 410.

It can be known from the above descriptions that, in the embodiments of the present invention, when the slope of the temperature-to-frequency curve of the first MEMS resonator is different from that of the second MEMS resonator, the temperature compensated oscillator of the embodiments of the present invention can use the frequency difference of the MEMS resonators to determine if the temperature of the MEMS resonator groups is increased or decreased, and to control the heating device accordingly.

Although the present disclosure has been described above as in some embodiments, it is not used to limit the present disclosure. It will be intended to those skilled in the art that various modifications and variations can be made to the structure of the present disclosure without departing from the scope or spirit of the disclosure. Therefore, the scope of the disclosure is to be defined solely by the appended claims.

What is claimed is:

1. A temperature compensated oscillator, comprising:
    a micro electro mechanical systems (MEMS) resonator group, comprising:
        a first MEMS resonator, configured to output a main oscillation frequency; and
        a second MEMS resonator, configured to output an auxiliary oscillation frequency;
    a heating device, configured to increase temperature of the MEMS resonator group;
    a connection body, connected between the MEMS resonator group and the heating device to transmit heat from the heating device to the MEMS resonator group, and configured to electrically isolate the MEMS resonator group from the heating device; and
    controller, configured to control the heating device in accordance with a difference between the main oscillation frequency and the auxiliary oscillation frequency.

2. The temperature compensated oscillator of claim 1, wherein a first slope of a first relationship curve representing a relationship between the main oscillation frequency and the temperature of the MEMS resonator group is not equal to a second slope of a second relationship curve representing relationship between the auxiliary oscillation frequency and the temperature of the MEMS resonator group.

3. The temperature compensated oscillator of claim 2, wherein the first slope and the second slope are positive, and the first slope is smaller than the second slope.

4. The temperature compensated oscillator of claim 3, wherein the controller turns on the heating device when the difference between the main oscillation frequency and the auxiliary oscillation frequency is greater than a predetermined standard value of frequency difference.

5. The temperature compensated oscillator of 4, wherein the controller turns off the heating device when the difference between the main oscillation frequency and the auxiliary oscillation frequency is smaller than the predetermined standard value of frequency difference.

6. The temperature compensated oscillator of claim 1, wherein the heater is a resistor heater.

7. The temperature compensated oscillator of 6, wherein the resistor heater comprises:
    a first contact pad, configured to provide a first voltage;
    a second contact pad, configured to provide a second voltage; and
    a resistor, electrically connected between the first contact pad and the second contact pad to provide heat energy in accordance with a voltage difference between the first voltage and the second voltage.

8. The temperature compensated oscillator of claim 7, wherein the connection body is connected between the resistors and the MEMS resonator group.

9. The temperature compensated oscillator of claim 8, wherein the connection body is formed from insulator material.

10. The temperature compensated oscillator of claim 1, wherein the first MEMS resonator includes material having a positive temperature coefficient of frequency (TCF).

* * * * *